(12) United States Patent
Lu

(10) Patent No.: US 10,084,438 B2
(45) Date of Patent: Sep. 25, 2018

(54) CLOCK GENERATOR USING PASSIVE MIXER AND ASSOCIATED CLOCK GENERATING METHOD

(71) Applicant: MEDIATEK INC., Hsin-Chu (TW)

(72) Inventor: Hsi-Liang Lu, Hsinchu (TW)

(73) Assignee: MEDIATEK INC., Hsin-Chu (TW)

(*) Notice: Subject to any disclaimer, the term of this patent is extended or adjusted under 35 U.S.C. 154(b) by 0 days.

(21) Appl. No.: 15/412,048

(22) Filed: Jan. 22, 2017

(65) Prior Publication Data
US 2017/0272062 A1 Sep. 21, 2017

Related U.S. Application Data

(60) Provisional application No. 62/308,879, filed on Mar. 16, 2016.

(51) Int. Cl.
H03K 5/13 (2014.01)
H03K 5/135 (2006.01)
H03D 7/14 (2006.01)
H04L 7/033 (2006.01)
H03B 19/14 (2006.01)

(52) U.S. Cl.
CPC ............ *H03K 5/135* (2013.01); *H03B 19/14* (2013.01); *H03D 7/1441* (2013.01); *H03D 7/1458* (2013.01); *H03D 7/1466* (2013.01); *H03D 7/1483* (2013.01); *H04L 7/0331* (2013.01)

(58) Field of Classification Search
CPC ...... H03K 5/1565; H03K 5/133; H03K 5/135; H03K 5/14; H03K 5/13; H03D 19/14; H03D 27/00; H03D 7/165
USPC ......................................... 327/231, 238, 239
See application file for complete search history.

(56) References Cited

U.S. PATENT DOCUMENTS 5,077,546 A 12/1991 Carfi
6,144,236 A 11/2000 Vice
7,248,850 B2 7/2007 Shen
(Continued)

FOREIGN PATENT DOCUMENTS

EP 2 983 289 A1 2/2016
WO 2011047354 A1 4/2011

OTHER PUBLICATIONS

Wang Xiao et al., "Analysis and design of a 1.8-2.7 GHz tunable 8-band TDD LTE receiver front-end", Journal of Semiconductors, vol. 32, No. 5, May 2011, 2011 Chinese Institute of Electronics, http://iopscience.iop.org/article/10.1088/1674-4926/32/5/055006/pdf, pp. 055006-1-055006-7.

*Primary Examiner* — John Poos
(74) *Attorney, Agent, or Firm* — Winston Hsu

(57) ABSTRACT

A clock generator has a buffer stage circuit, a passive mixer, and a channel selecting circuit. The buffer stage circuit receives a plurality of first reference clocks having a same first frequency but different phases. The passive mixer receives the first reference clocks from the buffer stage circuit, receives a plurality of second reference clocks having a same second frequency but different phases, and mixes the first reference clocks and the second reference clocks to generate a mixer output, wherein the second frequency is different from the first frequency. The channel selecting circuit extracts a plurality of third reference clocks from the mixer output, wherein the third reference clocks have a same third frequency but different phases, and the third frequency is different from the first frequency and the second frequency.

20 Claims, 11 Drawing Sheets

(56) References Cited

U.S. PATENT DOCUMENTS

| | | |
|---|---|---|
| 8,649,749 B2 | 2/2014 | He |
| 2005/0233725 A1 | 10/2005 | Muhammad |
| 2006/0057983 A1* | 3/2006 | Thompson ........... H03D 7/1441 455/127.3 |
| 2007/0049236 A1 | 3/2007 | Naito |
| 2008/0268805 A1 | 10/2008 | Hsieh |
| 2009/0028216 A1 | 1/2009 | Gresham |
| 2009/0189700 A1 | 7/2009 | Kuroda |
| 2009/0243690 A1 | 10/2009 | Zhang |
| 2010/0171542 A1 | 7/2010 | Dawe |
| 2012/0119807 A1* | 5/2012 | Ozeki .............. G01R 31/31726 327/237 |
| 2012/0149321 A1* | 6/2012 | Montalvo ................ H04B 1/30 455/232.1 |
| 2012/0256676 A1 | 10/2012 | Bellaouar |
| 2014/0152371 A1 | 6/2014 | Goel |
| 2014/0294132 A1* | 10/2014 | Yamaguchi ............ H03K 5/133 375/362 |
| 2015/0055726 A1 | 2/2015 | Yamaji |

* cited by examiner

CLOCK GENERATOR USING PASSIVE MIXER AND ASSOCIATED CLOCK GENERATING METHOD

CROSS REFERENCE TO RELATED APPLICATIONS

This application claims the benefit of U.S. provisional application No. 62/308,879, filed on Mar. 16, 2016 and incorporated herein by reference.

BACKGROUND

The present invention relates to a clock generator design, and more particularly, to a clock generator using a passive mixer and an associated clock generating method.

Wireless transceivers are used in a wide variety of wireless communications devices. A wireless transceiver may typically include a wireless receiver for receiving and demodulating signals, and a transmitter for modulating signals for transmission. Wireless transceivers generally include a local-oscillator (LO) generator. The LO generator is used to provide an LO output that can be used, for example, in a mixer to down-convert a received radio frequency (RF) signal to a baseband (BB) signal for signal reception, and may be used in a mixer to up-convert a BB signal to an RF signal for signal transmission. However, power consumption of the conventional LO generator is high. Thus, there is a need for an innovative clock generator design which can be used to realize a low-power LO generator.

SUMMARY

One of the objectives of the claimed invention is to provide a clock generator using a passive mixer and an associated clock generating method.

According to a first aspect of the present invention, an exemplary clock generator is disclosed. The exemplary clock generator includes a buffer stage circuit, a passive mixer, and a channel selecting circuit. The buffer stage circuit is configured to receive a plurality of first reference clocks having a same first frequency but different phases. The passive mixer is configured to receive the first reference clocks from the buffer stage circuit, receive a plurality of second reference clocks having a same second frequency but different phases, and mix the first reference clocks and the second reference clocks to generate a mixer output, wherein the second frequency is different from the first frequency. The channel selecting circuit is configured to extract a plurality of third reference clocks from the mixer output, wherein the third reference clocks have a same third frequency but different phases, and the third frequency is different from the first frequency and the second frequency.

According to a second aspect of the present invention, an exemplary clock generating method is disclosed. The exemplary clock generating method includes: receiving a plurality of first reference clocks having a same first frequency but different phases; receiving, by a passive mixer, the first reference clocks from the buffer stage circuit; receiving, by the passive mixer, a plurality of second reference clocks having a same second frequency but different phases, wherein the second frequency is different from the first frequency; mixing, by the passive mixer, the first reference clocks and the second reference clocks to generate a mixer output; and performing channel selection upon the mixer output to extract a plurality of third reference clocks from the mixer output, wherein the third reference clocks have a same third frequency but different phases, and the third frequency is different from the first frequency and the second frequency.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
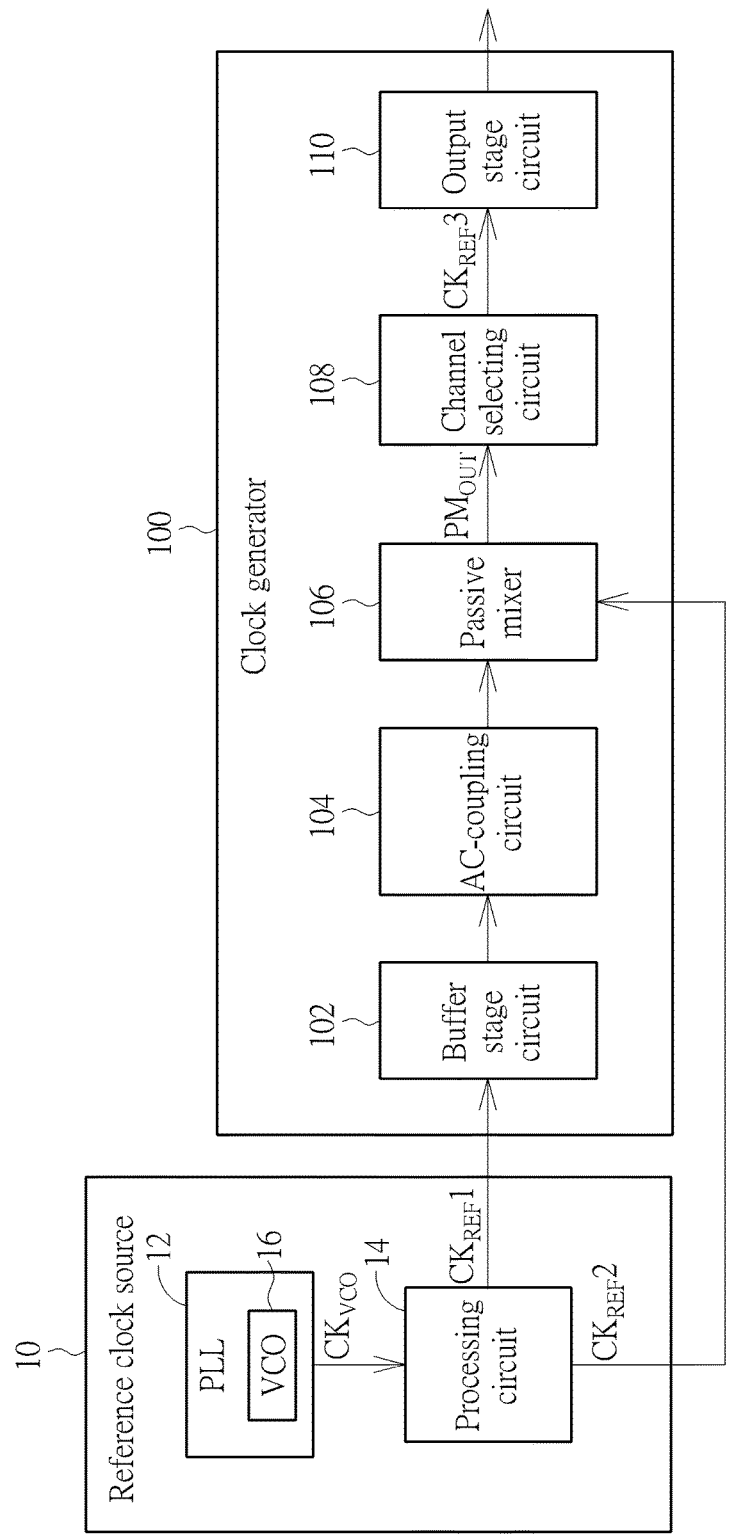
FIG. 1 is a block diagram illustrating a first clock generator according to an embodiment of the present invention.

FIG. 1 is a block diagram illustrating a first clock generator according to an embodiment of the present invention.

For example, the clock generator 100 may be a local-oscillator (LO) generator employed in a wireless communications device for providing LO signals needed by an up-converter in a transmit (TX) chain and/or a down-converter in a receive (RX) chain. However, this is not meant to be a limitation of the present invention. For example, any clock generator using the proposed low-power clock generator design still falls within the scope of the present invention. In this embodiment, the clock generator 100 includes, but not limited to, a buffer stage circuit 102, an alternating current (AC) coupling circuit 104, a passive mixer 106, a channel selecting circuit 108, and an output stage circuit 110. The buffer stage circuit 102 is configured to receive a plurality of first reference clocks (collectively denoted by "$CK_{REF}1$") from a reference clock source 10. For example, the reference clock source 10 may include a phase-locked loop (PLL) 12 and a processing circuit 14. The PLL 12 includes a controllable oscillator such as a voltage-controlled oscillator (VCO) 16. Hence, a closed-loop control is applied to the VCO 16 to make the VCO 16 locked to a desired oscillation frequency $F_{VCO}$, such that an oscillation signal $CK_{VCO}$ with the desired oscillation frequency $F_{VCO}$ is generated to the processing circuit 14 for further processing. The processing circuit 14 includes logic gates needed to generate the first reference clocks $CK_{REF}1$ according to the oscillation signal $CK_{VCO}$, where the first reference clocks $CK_{REF}1$ have the same first frequency $F_1$ but different phases. In addition, the processing circuit 14 further includes logic gates needed to generate a plurality of second reference clocks (collectively denoted by "$CK_{REF}2$") having the same second frequency $F_2$ but different phases, wherein the second frequency $F_2$ is different from the first frequency $F_1$. For example, the first reference clocks $CK_{REF}1$ may be generated based on the oscillation signal $CK_{VCO}$, and the second reference clocks $CK_{REF}2$ may be generated based on the first reference clocks $CK_{REF}1$, wherein the oscillation frequency $F_{VCO}$ may be higher than the first frequency $F_1$, and the first frequency $F_1$ may be higher than the second frequency $F_2$.

The AC-coupling circuit 104 is coupled between the buffer stage circuit 102 and the passive mixer 106, such that the first reference clocks $CK_{REF}1$ are transmitted from the buffer stage circuit 102 to the passive mixer 106 via AC coupling. The passive mixer 106 is configured to receive the first reference clocks $CK_{REF}1$ from the buffer stage circuit 102, receive the second reference clocks $CK_{REF}2$ from the reference clock source 10, and mix the first reference clocks $CK_{REF}1$ and the second reference clocks $CK_{REF}2$ to generate a mixer output $PM_{OUT}$. For example, the passive mixer 106 may be implemented using a voltage-mode passive mixer which processes a voltage input and generate a voltage output.

The channel selecting circuit 108 is configured to extract a plurality of third reference clocks (collectively denoted by "$CK_{REF}3$") from the mixer output $PM_{OUT}$, wherein the third reference clocks $CK_{REF}3$ have the same third frequency $F_3$ but different phases. The third frequency $F_3$ is different from the first frequency $F_1$ and the second frequency $F_2$. For example, with a proper design of the channel selecting circuit 108, the third frequency $F_3$ may be equal to a sum of the first frequency $F_1$ and the second frequency $F_2$ (i.e., $F_3=F_1+F_2$). That is, the channel selecting circuit 108 is designed for performing channel selection (i.e., frequency selection) upon the mixer output $PM_{OUT}$ which is composed of signal components with different frequencies. In this way, the third reference clocks $CK_{REF}3$ with the desired third frequency $F_3$ can be extracted from the mixer output $PM_{OUT}$.

In one exemplary design, the channel selecting circuit 108 may have an inductor-capacitor (LC) tank circuit for frequency selection. In another exemplary design, the channel selecting circuit 108 may have a band-pass filter for frequency selection. In yet another exemplary design, the channel selecting circuit 108 may have a translational filter for frequency selection. However, these are for illustrative purposes only, and are not meant to be limitations of the present invention.

The output stage circuit 110 is configured to receive the third reference clocks $CK_{REF}3$ from the channel selecting circuit 108, and output the third reference clocks $CK_{REF}3$ to a circuit component (e.g., an up-converter or a down-converter) that requires the third reference clocks $CK_{REF}3$ as its clock input.

Compared to an active mixer, the passive mixer (e.g., voltage-mode passive mixer) 106 has no power consumption due to no current flowing therethrough. In this way, a low-power LO generator can be realized by using the proposed clock generator 100 shown in FIG. 1. Moreover, when the semiconductor process is scaled (e.g., an advanced semiconductor process is employed), an input buffer (e.g., buffer stage circuit 102) preceding the passive mixer 206 and a mixer load (e.g., channel selecting circuit 108) following the passive mixer (e.g., voltage-mode passive mixer) 206 are also scaled. Hence, the power consumption of the clock generator 100 can be scaled with the semiconductor process. Further, due to inherent characteristics of the passive mixer (e.g., voltage-mode passive mixer) 106, the passive mixer (e.g., voltage-mode passive mixer) 106 is suitable for low-voltage operation, and the gain variation of the passive mixer (e.g., voltage-mode passive mixer) 106 is small. Since the gain variation of the passive mixer (e.g., voltage-mode passive mixer) 106 is small, the output swing is almost constant and no amplitude calibration is needed. Since the amplitude calibration can be omitted, the calibration time and digital assisted circuit can also be reduced.

As mentioned above, the third frequency $F_3$ may be equal to a sum of the first frequency $F_1$ and the second frequency $F_2$ (i.e., $F_3=F_1+F_2$). In a case where the oscillation frequency $F_{VCO}$ is an integer multiple of the first frequency $F_1$ and is also an integer multiple of the second frequency $F_2$, the oscillation frequency $F_{VCO}$ may not be an integer multiple of the third frequency $F_3$. For example, the oscillation frequency $F_{VCO}$ may be 6.4 GHz, the first frequency $F_1$ may be 3.2 GHz, the second frequency $F_2$ may be 1.6 GHz, and the third frequency $F_3$ may be 4.8 GHz. When the third reference clocks $CK_{REF}3$ are used as LO signals in a wireless communications device, the VCO pulling effect can be avoided/mitigated under a condition that the VCO frequency is not an integer multiple of the LO frequency. Moreover, compared to an LO generator using an active mixer, the clock generator 100 used as an LO generator can have lower power consumption as well as better noise performance.

Figure 2:
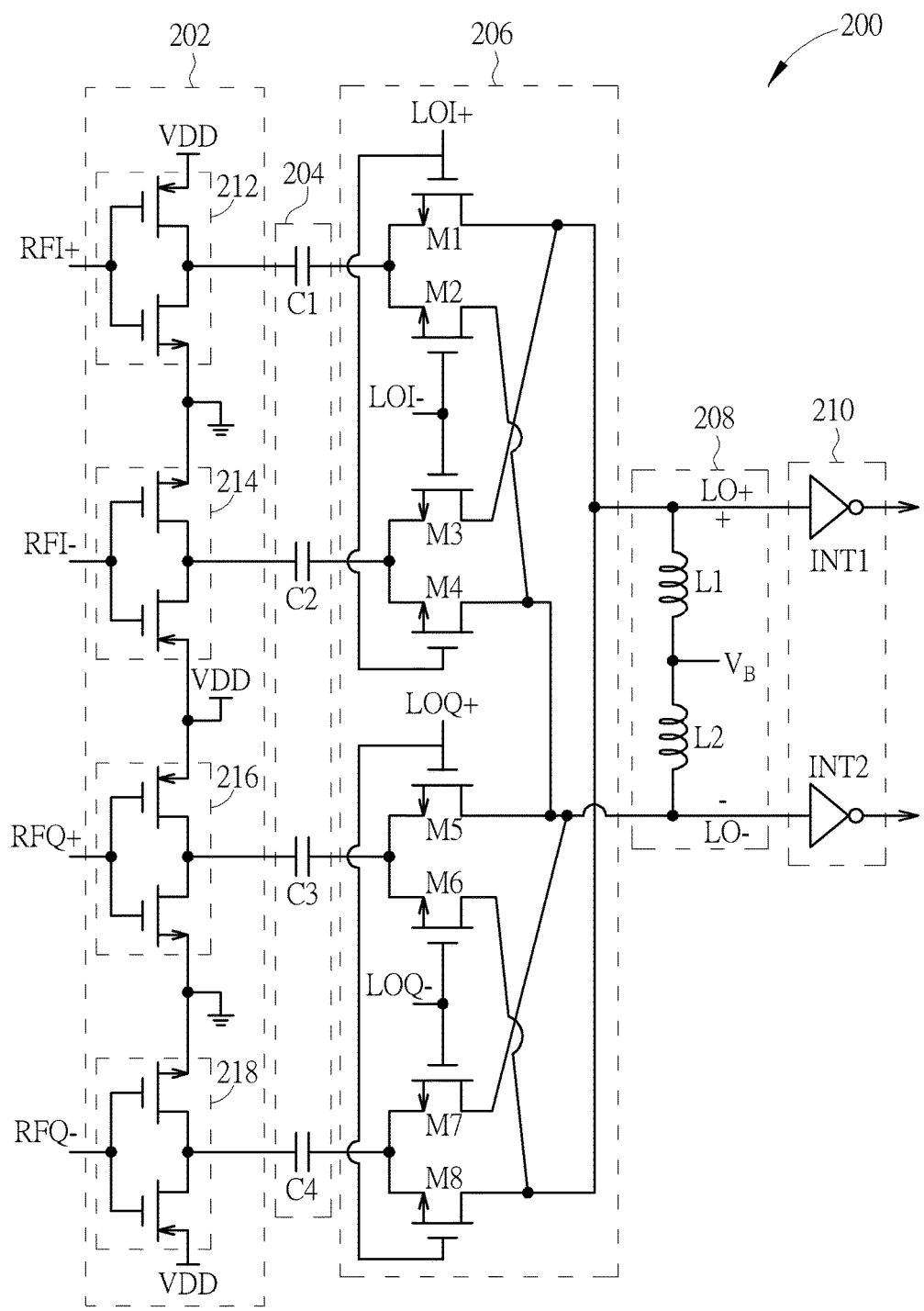
FIG. 2 is a circuit diagram of the clock generator shown in FIG. 1 according to an embodiment of the present invention.

FIG. 2 is a circuit diagram of the clock generator shown in FIG. 1 according to an embodiment of the present invention. The clock generator 200 shown in FIG. 2 follows the proposed low-power clock generator design shown in FIG. 1. Hence, in accordance with the proposed low-power clock generator design shown in FIG. 1, the clock generator 200 has a buffer stage circuit 202, an AC-coupling circuit 204, a passive mixer 206, a channel selecting circuit 208, and an output stage circuit 210. The buffer stage circuit 202 receives a plurality of first reference clocks RFI+, RFI−, RFQ+, RFQ− having the same first frequency $F_1$ (e.g., 3.2 GHz) but different phases. For example, the first reference clocks RFI+ and RFI− have a 180-degree phase difference, the first reference clocks RFQ+ and RFQ− have a 180-degree phase difference, the first reference clocks RFI+ and RFQ+ has a 90-degree phase difference, and the first reference clocks RFI− and RFQ− has a 90-degree phase difference. In this embodiment, the buffer stage circuit 202 is implemented by a plurality of inverters 212, 214, 216, 218 used as current reuse amplifiers that can increase transconductance of the buffer stage with the same power dissipation.

The AC-coupling circuit 204 is implemented by a plurality of capacitors C1, C2, C3 and C4, such that the first reference clocks RFI+, RFI−, RFQ+, RFQ− are transmitted from the buffer stage circuit 202 to the passive mixer 206 via AC-coupling capacitors C1-C4. The passive mixer 206 is implemented by a voltage-mode passive mixer for receiving a voltage input (i.e., first reference clocks RFI+, RFI−, RFQ+, RFQ−) and generating a voltage output (i.e., mixer output). The passive mixer 206 has a plurality of switches implemented using N-channel metal oxide semiconductor (NMOS) transistors M1-M8. Alternatively, the switches M1-M8 may be implemented using P-channel metal oxide semiconductor (PMOS) transistors, complementary metal oxide semiconductor (CMOS) transistors, or other metal oxide semiconductor field effect transistors (MOSFETs). In other words, the present invention has no limitations on the actual implementation of mixer switches. Each of the switches (e.g., NMOS transistors M1-M8) has a control node (e.g., gate), a first connection node (e.g., source) and a second connection node (e.g., drain), wherein the control node is configured to receive one of the second reference clocks LOI+, LOI−, LOQ+, LOQ− having the same second frequency $F_2$ (e.g., 1.6 GHz) but different phases, the first connection node is coupled to (e.g., indirectly connected to) the buffer stage circuit 202 via the AC-coupling circuit 204, and the second connection node is coupled to (e.g., directly connected to) the channel selecting circuit 208. For example, the second reference clocks LOI+ and LOI− have a 180-degree phase difference, the second reference clocks LOQ+ and LOQ− have a 180-degree phase difference, the second reference clocks LOI+ and LOQ+ has a 90-degree phase difference, and the second reference clocks LOI− and LOQ− has a 90-degree phase difference.

In accordance with a mixer structure of the passive mixer 206, the first reference clocks RFI+, RFI−, RFQ+, RFQ− and the second reference clocks LOI+, LOI−, LOQ+, LOQ− are mixed to generate a mixer output having higher-frequency signal components and lower-frequency signal components. As shown in FIG. 2, an output of mixing the first reference clocks RFI+, RFI− and the second reference clocks LOI+, LOI− and an output of mixing the first reference clocks RFQ+, RFQ− and the second reference clocks LOQ+, LOQ− are combined at an output port of the passive mixer 206. If the second reference clocks LOI+, LOI−, LOQ+, LOQ− are not properly set, cross-talk between the output of mixing the first reference clocks RFI+, RFI− and the second reference clocks LOI+, LOI− and the output of mixing the first reference clocks RFQ+, RFQ− and the second reference clocks LOQ+, LOQ− will occur. To minimize the undesired cross-talk effect, the second reference clocks LOI+, LOI−, LOQ+, LOQ− generated from a reference clock source (e.g., reference clock source 10 shown in FIG. 1) may be non-overlapping clocks each having a duty cycle smaller than 50%. For example, the duty cycle of each of the non-overlapping clocks may be within a range from 15% to 35%. Since the undesired cross-talk effect can be minimized by using non-overlapping clocks as the second reference clocks supplied to control nodes of mixer switches in the passive mixer, the gain is larger and the spur is smaller. However, this is for illustrative purposes only, and is not meant to be a limitation of the present invention. For example, no matter whether non-overlapping clocks are used as second reference clocks supplied to control nodes of mixer switches, any low-power clock generator using a passive mixer falls within the scope of the present invention.

The channel selecting circuit 208 performs channel selection upon the mixer output to extract signal components of an interested channel (e.g., 4.8 GHz channel). In this embodiment, the channel selecting circuit 208 is implemented by an LC tank circuit with frequency selection, wherein the LC tank circuit comprises inductors L1 and L2 acting as an inductive load of the passive mixer 206, and a direct current (DC) bias voltage $V_B$ may be supplied to an interconnection node of the inductors L1 and L2. In this embodiment, the channel selecting circuit 208 outputs a plurality of third reference clocks LO+ and LO− with the same third frequency (e.g., 4.8 GHz) but different phases. For example, the third reference clocks LO+ and LO− have a 180-degree phase difference. The output stage circuit 210 receives and outputs the third reference clocks LO+ and LO−. For example, the output stage circuit 210 is implemented by a plurality of inverters INT1 and INT2 for outputting the third reference clocks LO+ and LO−, respectively.

Figure 3:
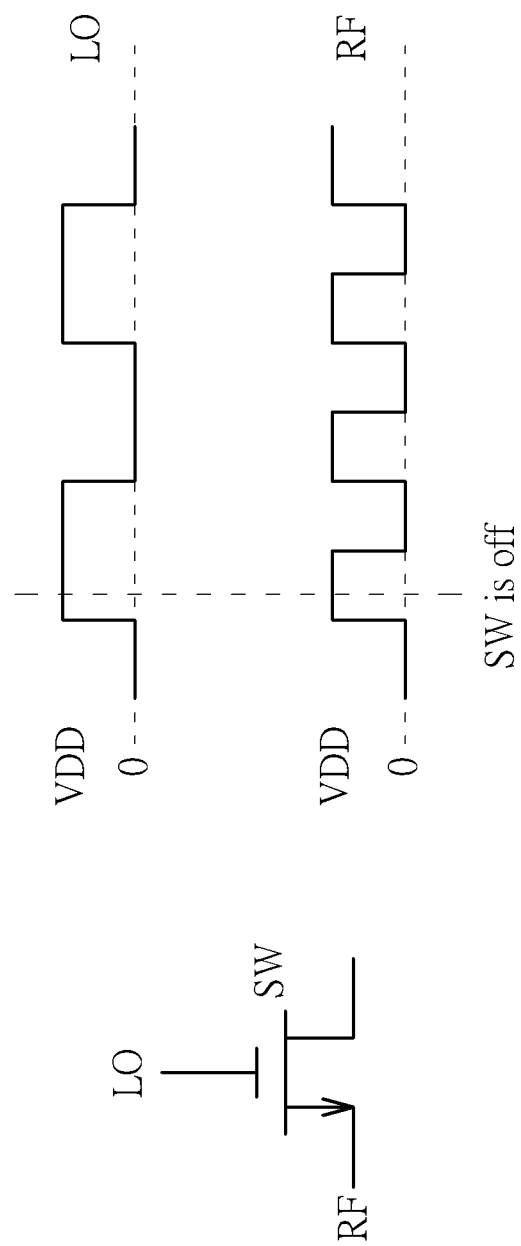
FIG. 3 is a diagram illustrating an abnormal operation of a mixer switch under a condition that a first reference clock and a second reference clock are both large signals with full swing.

Consider a case where the first reference clocks RFI+, RFI−, RFQ+, RFQ− and the second reference clocks LOI+, LOI−, LOQ+, LOQ− generated from a reference clock source (e.g., reference clock source 10 shown in FIG. 1) are full swing (i.e., rail-to-rail), the mixer function of the passive mixer 206 may be abnormal. FIG. 3 is a diagram illustrating an abnormal operation of a mixer switch under a condition that a first reference clock and a second reference clock are both large signals with full swing. As shown in FIG. 3, the second reference clock LO (e.g., one of second reference clocks LOI+, LOI−, LOQ+, LOQ−) is supplied to a control node of a mixer switch SW (e.g., one of switches M1-M8), and the first reference clock RF (e.g., one of first reference clocks RFI+, RFI−, RFQ+, RFQ−) is supplied to one of the connection nodes of the mixer switch SW. Ideally, the mixer switch SW should be switched on when the second reference clock LO has amplitude equal to the supply voltage VDD. However, since the first reference clock RF is also full swing, the first reference clock RF may have amplitude equal to the supply voltage VDD at the time the second reference clock LO has amplitude equal to the supply voltage VDD. As a result, when the second reference clock LO has amplitude equal to the supply voltage VDD, the mixer switch SW may not be switched on as expected, thus resulting in a large mixer loss.

Figure 4:
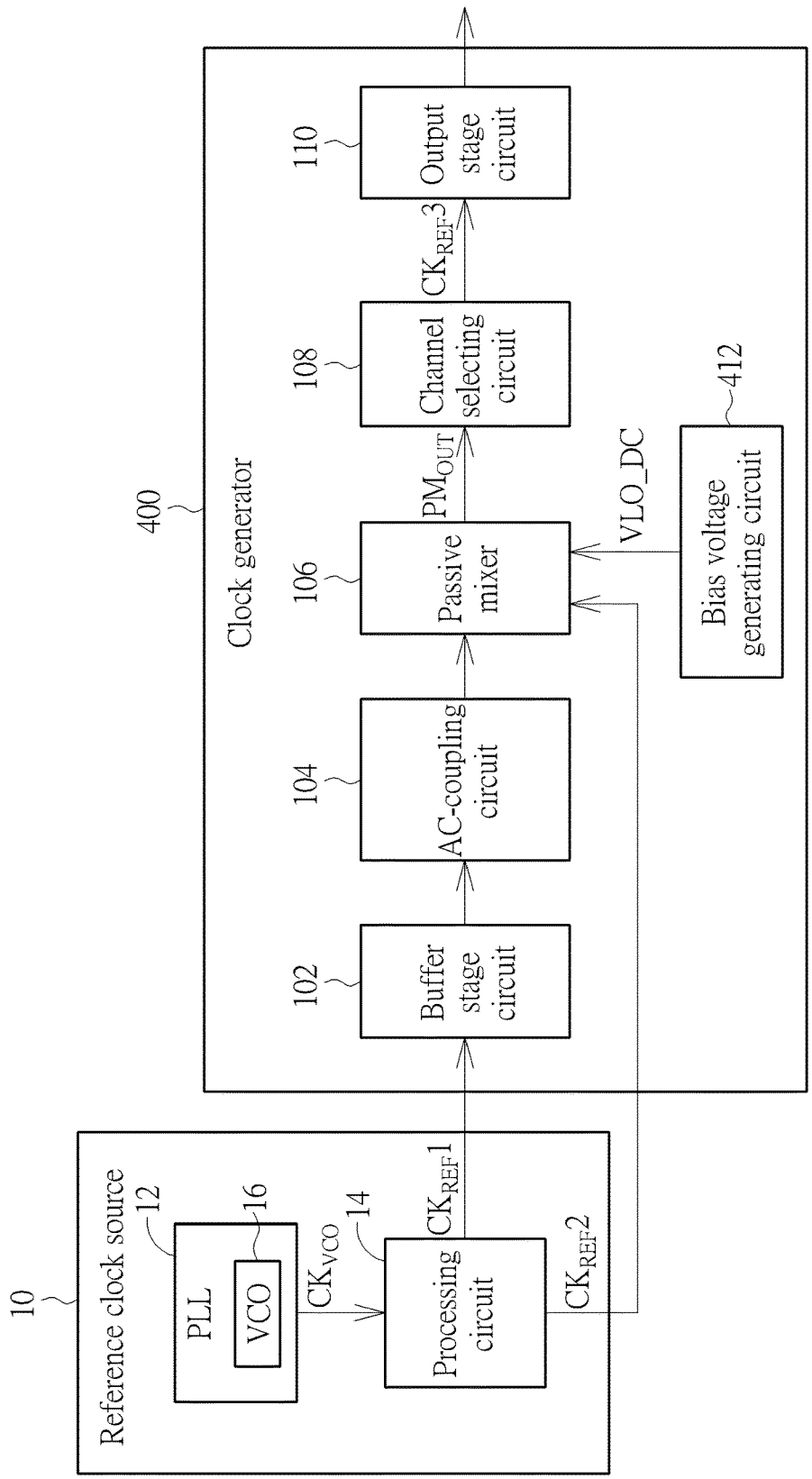
FIG. 4 is a block diagram illustrating a second clock generator according to an embodiment of the present invention.

To solve the above-mentioned mixer loss issue, the present invention further proposes supplying a DC bias voltage to the control node of each mixer switch. FIG. 4 is a block diagram illustrating a second clock generator according to an embodiment of the present invention. The major difference between the clock generator 400 shown in FIG. 4 and the clock generator 100 shown in FIG. 1 is that the clock generator 400 further includes a bias voltage generating circuit 412 configured to generate one bias voltage VLO_DC to the control node of each switch in the passive mixer 106. When the first reference clocks (collectively denoted by "$CK_{REF}1$") and the second reference clocks (collectively denoted by "$CK_{REF}2$") are both full swing, the clock generator 400 can generate the desired third reference clocks (collectively denoted by "$CK_{REF}3$") without suffering from mixer loss caused by the gate bias of mixer switches.

Figure 5:
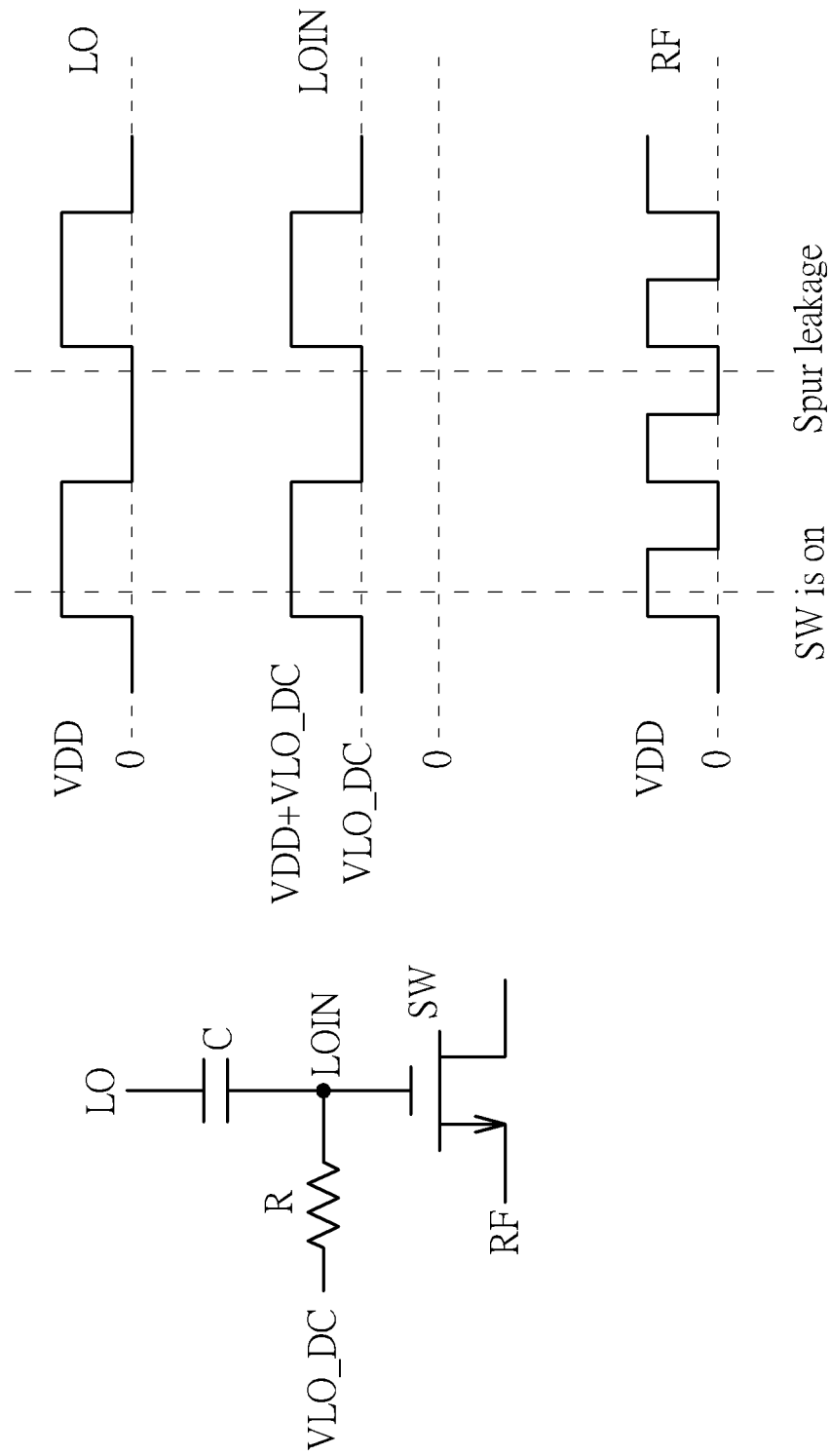
FIG. 5 is a diagram illustrating an operation of a mixer switch under a condition that a first reference clock and a second reference clock are both large signals with full swing and a DC bias voltage is supplied to a control node of a mixer switch.

FIG. 5 is a diagram illustrating an operation of a mixer switch under a condition that a first reference clock and a second reference clock are both large signals with full swing and a DC bias voltage is supplied to a control node of a mixer switch. As shown in FIG. 5, a bias voltage VLO_DC is supplied to a control node of a mixer switch SW via a resistor R, and the second reference clock LO is coupled to the control node of the mixer switch SW via a capacitor C. In this way, a DC-boosted second reference clock LOIN is present on the control node of the mixer switch SW. The first reference clock RF is supplied to one of the connection nodes of the mixer switch SW. Ideally, the mixer switch SW should be switched on when the second reference clock LO has amplitude equal to the supply voltage VDD. Since the largest amplitude VDD+VLO_DC possessed by the DC-boosted second reference clock LOIN is larger than the largest amplitude VDD possessed by the first reference clock RF, the mixer switch SW is turned on when both of the first reference clock RF and the second reference clock LO have the same amplitude equal to VDD. In other words, with the help of the bias voltage VLO_DC, the mixer switch SW is switched on each time the second reference clock LO has amplitude equal to the supply voltage VDD, thereby solving the aforementioned mixer loss issue.

Ideally, the mixer switch SW should be switched off when the second reference clock LO has amplitude equal to the ground voltage 0V. However, since the smallest amplitude VLO_DC possessed by the DC-boosted second reference clock LOIN is larger than the smallest amplitude 0V possessed by the first reference clock RF, the mixer switch SW may be switched on when the second reference clock LO has amplitude equal to the ground voltage 0V, thus increasing the spur leakage of the passive mixer. In this embodiment, the channel selecting circuit 108 with channel selection (i.e., frequency selection) can be reused for spur leakage rejection. In other words, the spur leakage increased due to the supplied bias voltage VLO_DC can be suppressed by the following channel selecting circuit (e.g., LC tank circuit) 108.

When the first reference clocks RFI+, RFI−, RFQ+, RFQ− and the second reference clocks LOI+, LOI−, LOQ+, LOQ− generated from a reference clock source (e.g., reference clock source 10 shown in FIG. 1) are full swing, the clock generator 200 shown in FIG. 2 can be modified to employ the proposed clock generator design shown in FIG. 4. For example, in accordance with the embodiment shown in FIG. 5, the clock generator 200 shown in FIG. 2 can be modified to include the bias voltage generator circuit 412 for supplying the bias voltage VLO_DC to control nodes of switches M1-M8 implemented in the passive mixer 206. As a person skilled in the art can readily understand circuit implementation details of the proposed low-power clock generator design shown in FIG. 4 after reading above paragraphs, further description is omitted here for brevity.

With regard to the embodiment shown in FIG. 1, the AC-coupling circuit 104 is coupled between the buffer stage circuit 102 and the passive mixer 106. However, this is for illustrative purposes only, and is not meant to be a limitation of the present invention.

Figure 6:
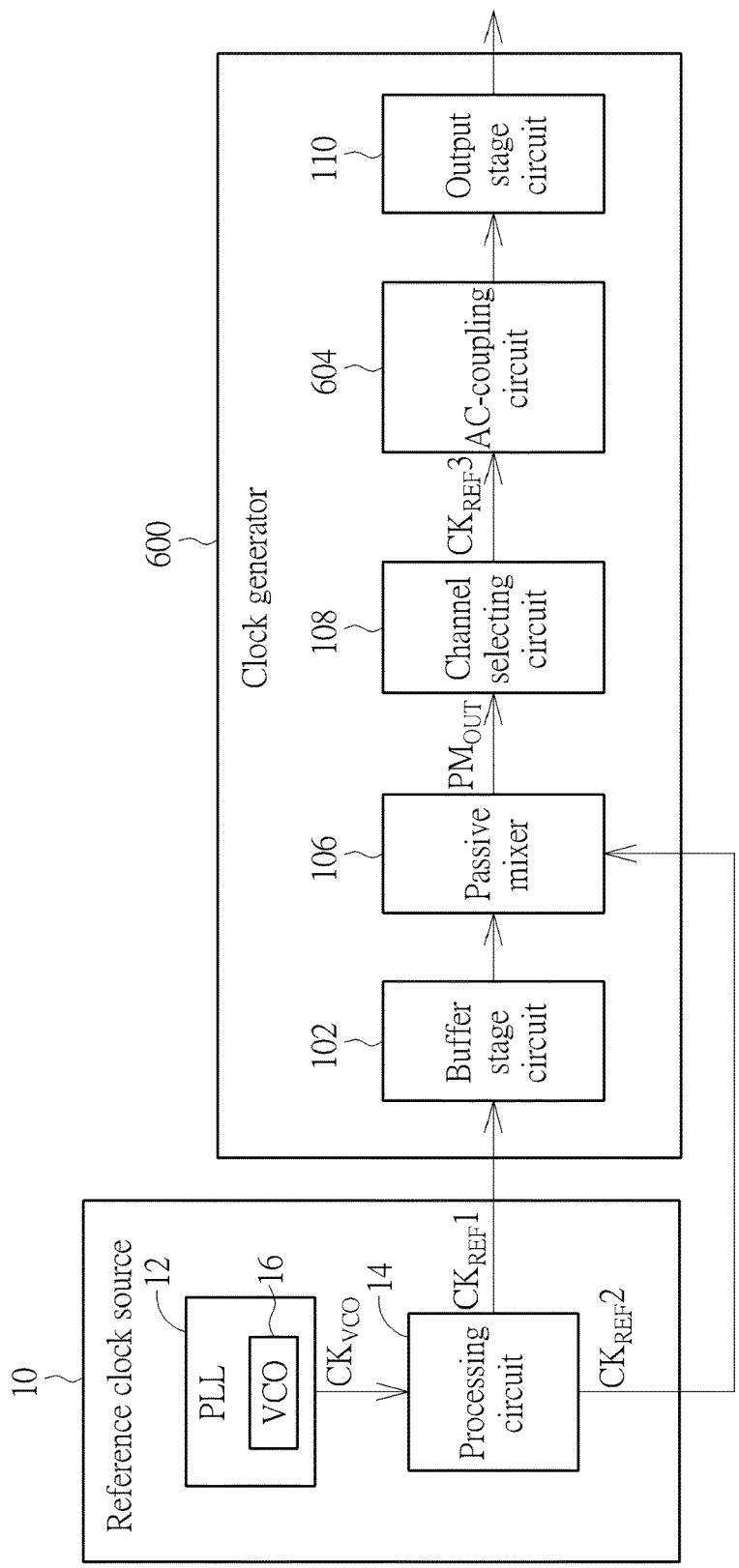
FIG. 6 is a block diagram illustrating a third clock generator according to an embodiment of the present invention.

FIG. 6 is a block diagram illustrating a third clock generator according to an embodiment of the present invention. The major difference between the clock generator 600 shown in FIG. 6 and the clock generator 100 shown in FIG. 1 is that an AC-coupling circuit 604 of the clock generator 600 is coupled between the channel selecting circuit 108 and the output stage circuit 110. Hence, concerning the clock generator 600, the first reference clocks (collectively denoted by "$CK_{REF}1$") are transmitted from the buffer stage circuit 102 to the passive mixer 106 without via any AC-coupling circuit, the mixer output $PM_{OUT}$ is transmitted from the passive mixer 106 to the channel selecting circuit 108 without via any AC-coupling circuit, and the third reference clocks (collectively denoted by "$CK_{REF}3$") are transmitted from the channel selecting circuit 108 to the output stage circuit 110 via the AC-coupling circuit 604.

Figure 7:
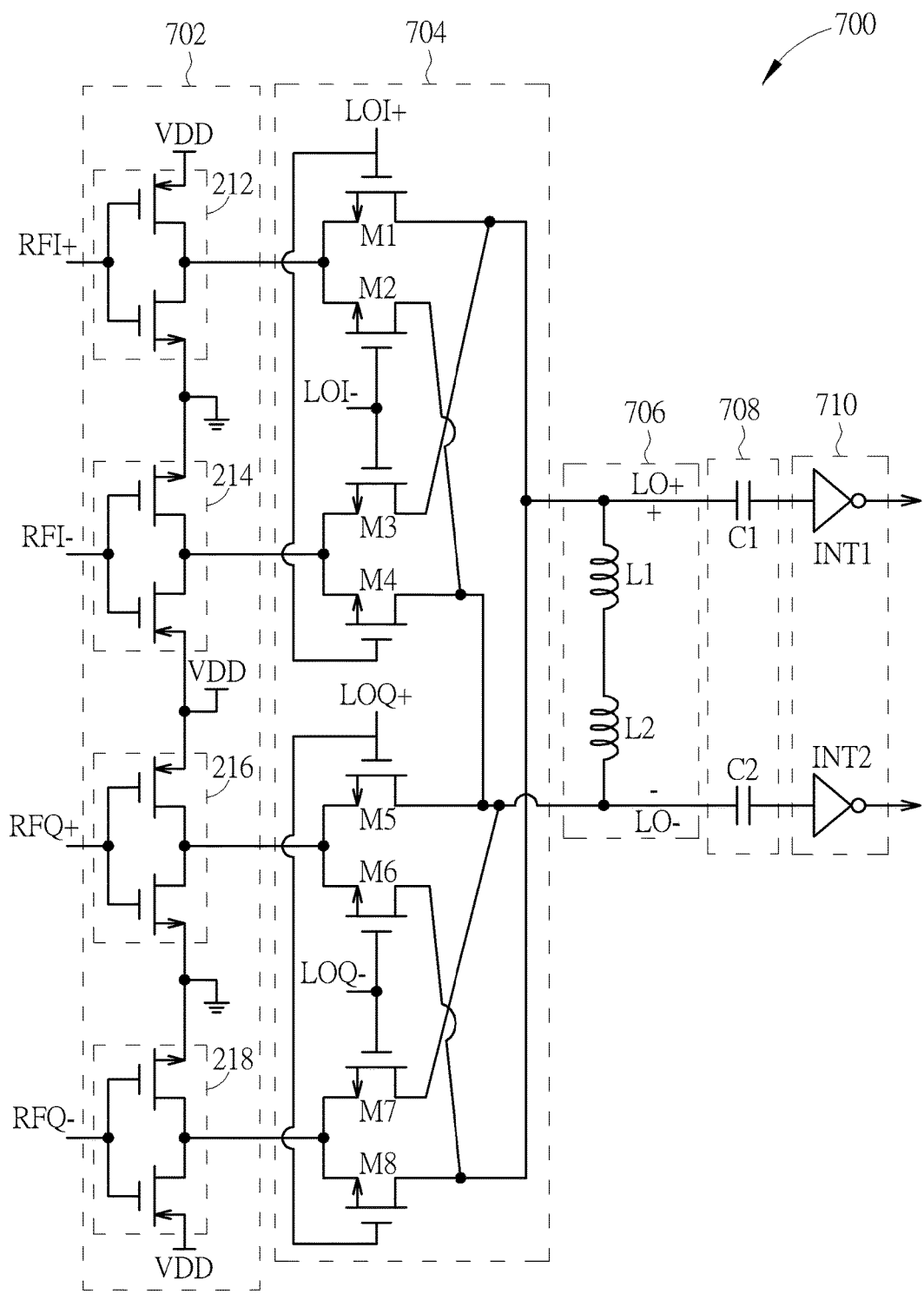
FIG. 7 is a circuit diagram of the clock generator shown in FIG. 6 according to an embodiment of the present invention.

FIG. 7 is a circuit diagram of the clock generator shown in FIG. 6 according to an embodiment of the present invention. The clock generator 700 shown in FIG. 7 follows the proposed low-power clock generator design shown in FIG. 6. Hence, in accordance with the proposed low-power clock generator design shown in FIG. 6, the clock generator 700 has a buffer stage circuit 702, a passive mixer 704, a channel selecting circuit 706, an AC-coupling circuit 708, and an output stage circuit 710. The major difference between the clock generator 700 shown in FIG. 7 and the clock generator 200 shown in FIG. 2 is that the clock generator 700 has no AC-coupling circuit between the buffer stage circuit 702 and the passive mixer 704, and has the AC-coupling circuit 708 coupled between the channel selecting circuit 706 and the output stage circuit 710. The AC-coupling circuit 708 is implemented by a plurality of capacitors C1 and C2, such that the third reference clocks LO+ and LO− are transmitted from the channel selecting circuit 706 to the output stage circuit 710 via AC-coupling capacitors C1 and C2, respectively.

Figure 8:
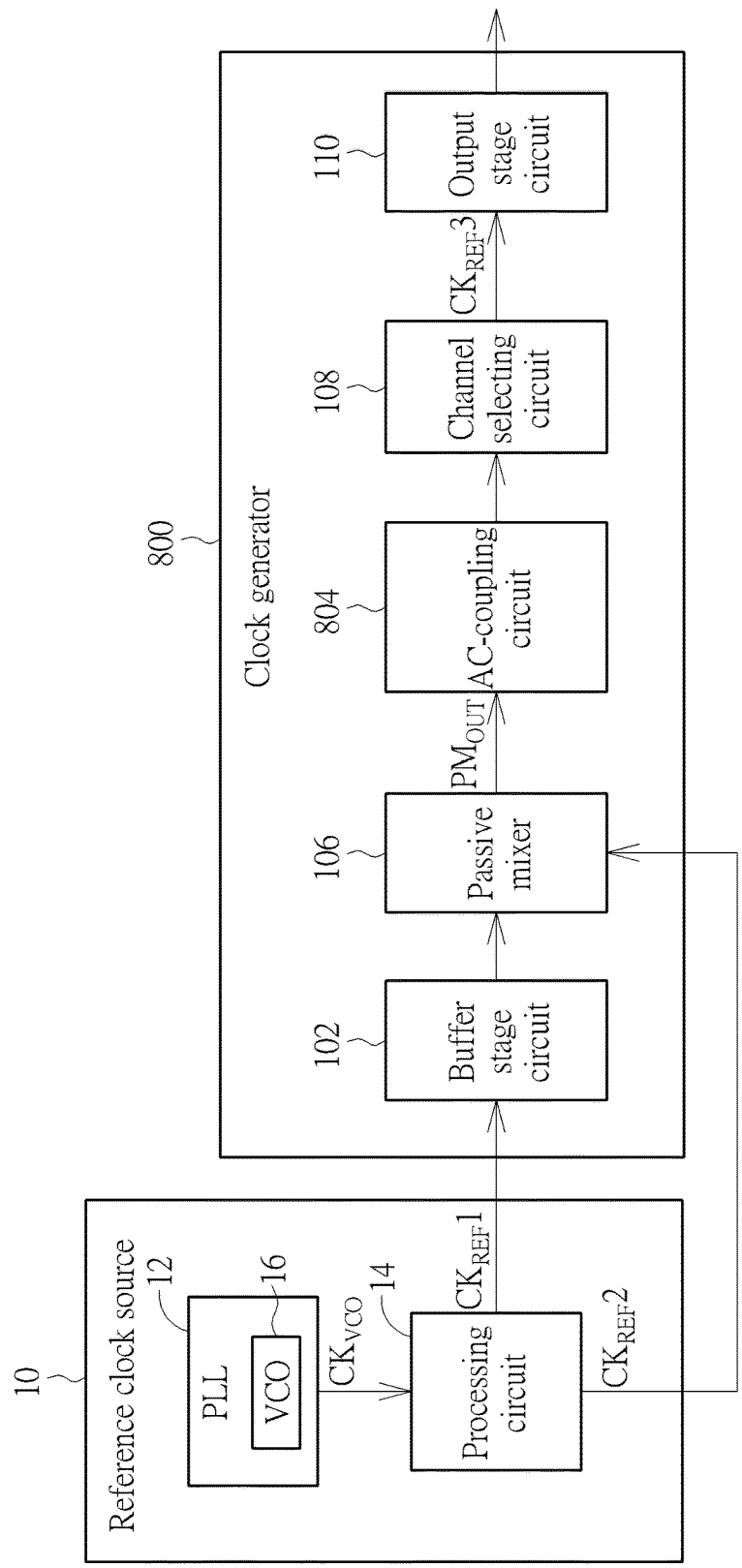
FIG. 8 is a block diagram illustrating a fourth clock generator according to an embodiment of the present invention.

FIG. 8 is a block diagram illustrating a fourth clock generator according to an embodiment of the present invention. The major difference between the clock generator 800 shown in FIG. 8 and the clock generator 100 shown in FIG. 1 is that an AC-coupling circuit 804 of the clock generator 800 is coupled between the passive mixer 106 and the channel selecting circuit 108. Hence, concerning the clock generator 800, the first reference clocks (collectively denoted by "$CK_{REF}1$") are transmitted from the buffer stage circuit 102 to the passive mixer 106 without via any AC-coupling circuit, and the mixer output $PM_{OUT}$ is transmitted from the passive mixer 106 to the channel selecting circuit 108 via the AC-coupling circuit 804.

Figure 9:
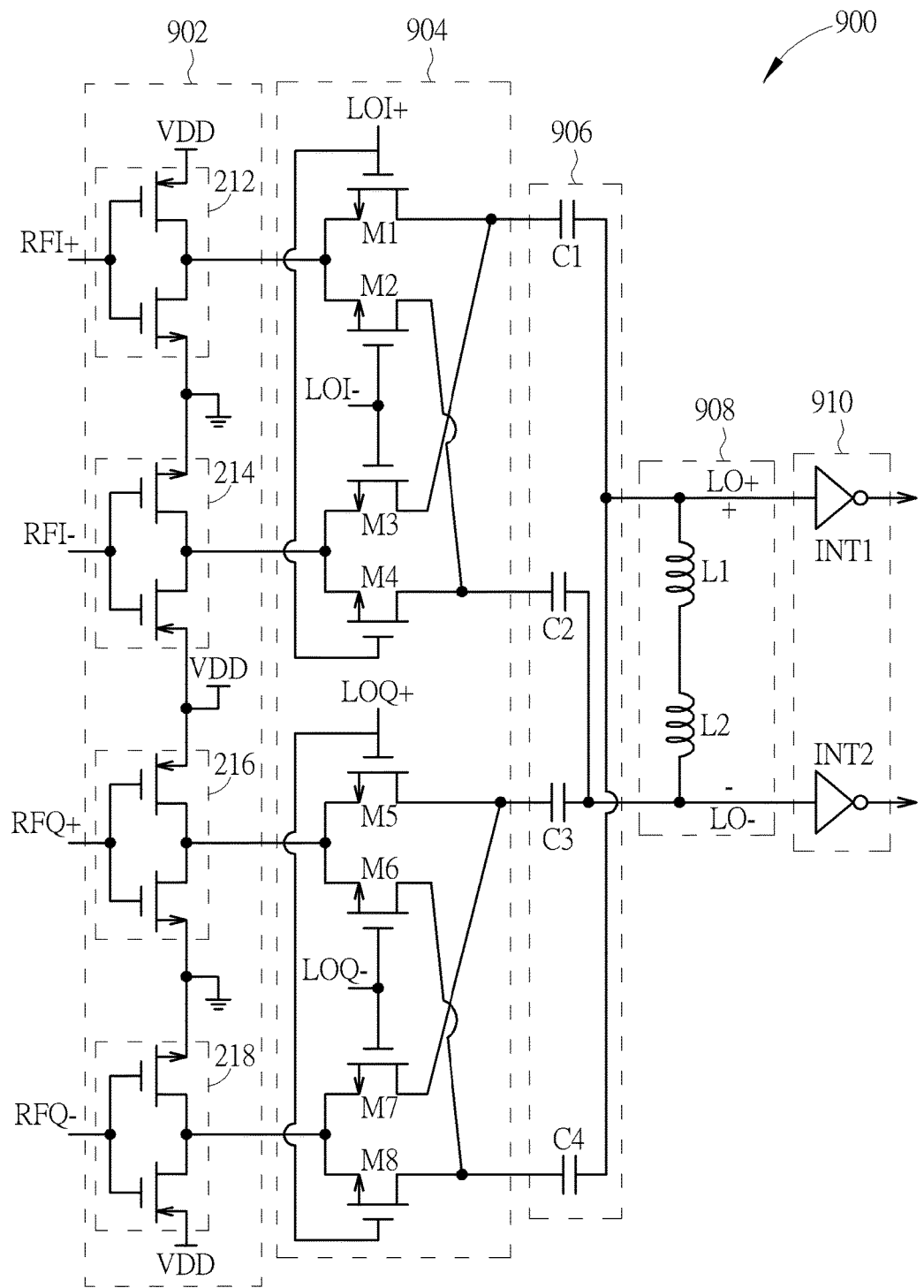
FIG. 9 is a circuit diagram of the clock generator shown in FIG. 8 according to an embodiment of the present invention.

FIG. 9 is a circuit diagram of the clock generator shown in FIG. 8 according to an embodiment of the present invention. The clock generator 900 shown in FIG. 9 follows the proposed low-power clock generator design shown in FIG. 8. Hence, in accordance with the proposed low-power clock generator design shown in FIG. 8, the clock generator 900 has a buffer stage circuit 902, a passive mixer 904, an AC-coupling circuit 906, a channel selecting circuit 908, and an output stage circuit 910. The major difference between the clock generator 900 shown in FIG. 9 and the clock generator 200 shown in FIG. 2 is that the clock generator 900 has no AC-coupling circuit between the buffer stage circuit 902 and the passive mixer 904, and has the AC-coupling circuit 906 coupled between the passive mixer 904 and the channel selecting circuit 908. The AC-coupling circuit 906 is implemented by a plurality of capacitors C1, C2, C3 and C4, such that the mixer output is transmitted from the passive mixer 904 to the channel selecting circuit 908 via AC-coupling capacitors C1-C4.

As mentioned above, when the first reference clocks RFI+, RFI−, RFQ+, RFQ− and the second reference clocks LOI+, LOI−, LOQ+, LOQ− generated from a reference clock source (e.g., reference clock source 10 shown in FIG. 6/FIG. 8) are full swing, the mixer function of the passive mixer 704/904 may be abnormal, thus resulting in the mixer loss. To solve the mixer loss issue, the clock generator 600/800 may be modified to include the aforementioned bias voltage generating circuit 412 used by the clock generator 400.

Figure 10:
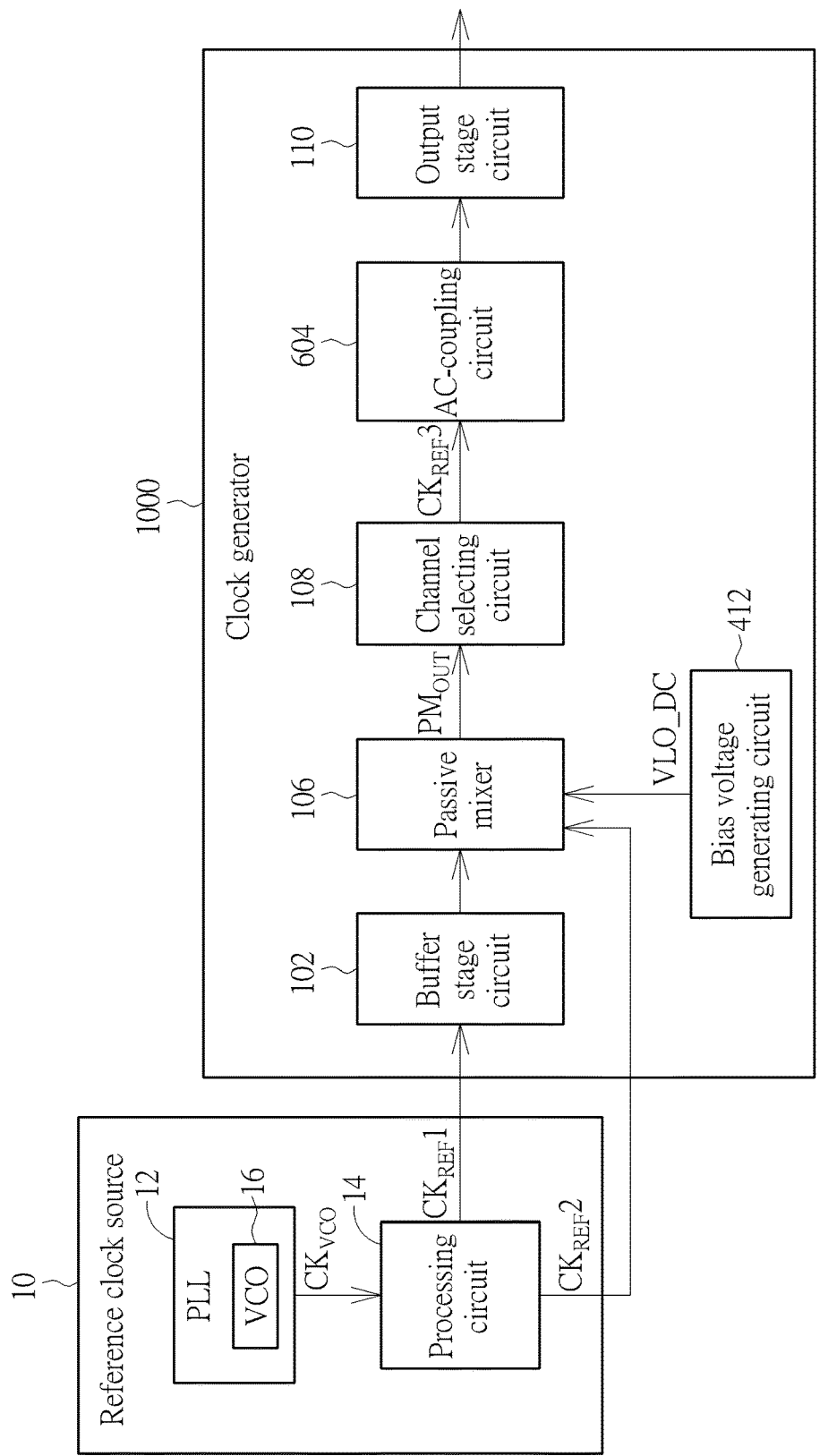
FIG. 10 is a block diagram illustrating a fifth clock generator according to an embodiment of the present invention.

FIG. 10 is a block diagram illustrating a fifth clock generator according to an embodiment of the present invention. The major difference between the clock generator 1000 shown in FIG. 10 and the clock generator 600 shown in FIG. 6 is that the clock generator 1000 further includes the bias voltage generating circuit 412 configured to generate one bias voltage VLO_DC to the control node of each switch in the passive mixer 106.

Figure 11:
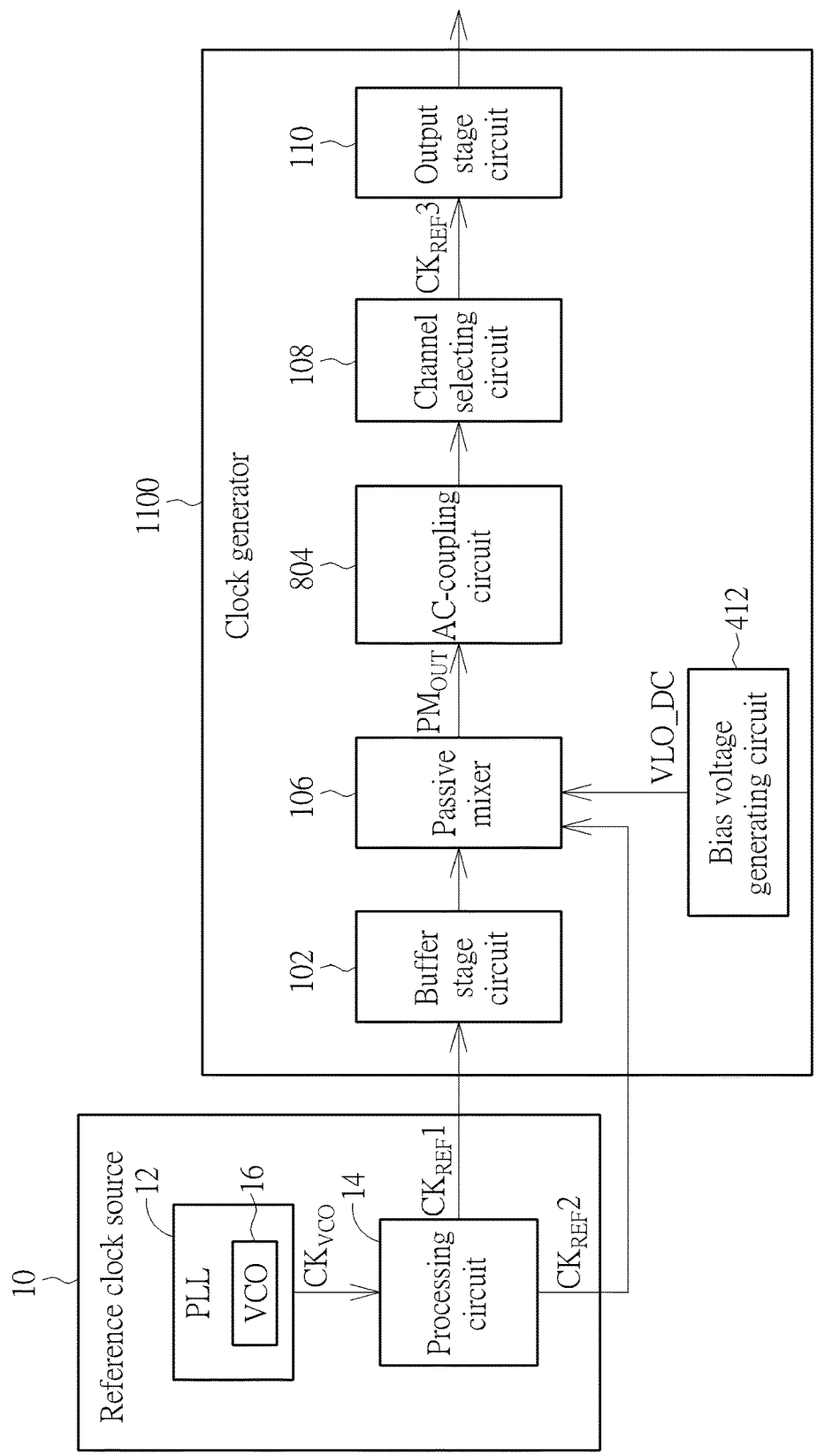
FIG. 11 is a block diagram illustrating a sixth clock generator according to an embodiment of the present invention.

FIG. 11 is a block diagram illustrating a sixth clock generator according to an embodiment of the present invention. The major difference between the clock generator 1100 shown in FIG. 11 and the clock generator 800 shown in FIG. 8 is that the second clock generator 1100 further includes the bias voltage generating circuit 412 configured to generate one bias voltage VLO_DC to the control node of each switch in the passive mixer 106.

The circuit implementation of the clock generator 1000/1100 can be achieved by modifying the circuit implementation shown in FIG. 7/FIG. 9. For example, the clock generator 700 shown in FIG. 7 may be modified to include the bias voltage generator circuit 412 for supplying the bias voltage VLO_DC to control nodes of switches M1-M8 implemented in the passive mixer 704. For another example, the clock generator 900 shown in FIG. 9 may be modified to include the bias voltage generator circuit 412 for supplying the bias voltage VLO_DC to control nodes of switches M1-M8 implemented in the passive mixer 904. As a person skilled in the art can readily understand circuit implementation details of the proposed low-power clock generator design shown in FIG. 10/FIG. 11 after reading above paragraphs, further description is omitted here for brevity.

It should be noted that circuit implementations illustrated in FIGS. 2, 7 and 9 and associated mixer switch bias based circuit modifications discussed above are for illustrative purposes only, and are not meant to be limitations of the present invention. Any clock generator structure using one of the proposed clock generator designs shown in FIGS. 1, 4, 6, 8, 10 and 11 falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock generator comprising:
a buffer stage circuit, configured to receive a plurality of first reference clocks having a same first frequency but different phases;
a passive mixer, configured to receive the first reference clocks from the buffer stage circuit, receive a plurality of second reference clocks having a same second frequency but different phases, and mix the first reference clocks and the second reference clocks to generate a mixer output, wherein the second frequency is different from the first frequency; and
a channel selecting circuit, configured to extract a plurality of third reference clocks from the mixer output, wherein the third reference clocks have a same third frequency but different phases, and the third frequency is different from the first frequency and the second frequency.

2. The clock generator of claim 1, wherein the passive mixer is a voltage-mode passive mixer; and the voltage-mode passive mixer comprises a plurality of switches implemented using N-channel metal oxide semiconductor (NMOS) transistors, P-channel metal oxide semiconductor (PMOS) transistors, or complementary metal oxide semiconductor (CMOS) transistors.

3. The clock generator of claim 1, wherein the second reference clocks are non-overlapping clocks each having a duty cycle smaller than 50%.

4. The clock generator of claim 1, wherein the passive mixer comprises:
a plurality of switches, each having a control node, a first connection node and a second connection, wherein the control node is configured to receive one of the second reference clocks, the first connection node is coupled to the buffer stage circuit, and the second connection node is coupled to the channel selecting circuit; and
the clock generator further comprises:
a bias voltage generating circuit, configured to supply one bias voltage to the control node.

5. The clock generator of claim 1, wherein the channel selecting circuit comprises an inductor-capacitor (LC) tank circuit.

6. The clock generator of claim 1, wherein the channel selecting circuit comprises a band-pass filter.

7. The clock generator of claim 1, wherein the channel selecting circuit comprises a translational filter.

8. The clock generator of claim 1, further comprising:
an alternating current (AC) coupling circuit, coupled between the buffer stage circuit and the passive mixer, wherein the first reference clocks are transmitted from the buffer stage circuit to the passive mixer via the AC coupling circuit.

9. The clock generator of claim 1, wherein the first reference clocks are transmitted from the buffer stage circuit to the passive mixer without via any alternating current (AC) coupling circuit, the mixer output is transmitted from the passive mixer to the channel selecting circuit without via any AC coupling circuit, and the clock generator further comprises:
an output stage circuit, configured to receive and output the third reference clocks generated from the channel selecting circuit; and
an AC coupling circuit, coupled between the channel selecting circuit and the output stage circuit, wherein the third reference clocks are transmitted from the channel selecting circuit to the output stage circuit via the AC coupling circuit.

10. The clock generator of claim 1, wherein the first reference clocks are transmitted from the buffer stage circuit to the passive mixer without via any alternating current (AC) coupling circuit, and the clock generator further comprises:
an AC coupling circuit, coupled between the passive mixer and the channel selecting circuit, wherein the mixer output is transmitted from the passive mixer to the channel selecting circuit via the AC coupling circuit.

11. The clock generator of claim 1, wherein the clock generator is a local-oscillator (LO) generator employed in a wireless communications device, and the third reference clocks are LO signals of the wireless communications device.

12. The clock generator of claim 11, wherein the buffer stage circuit receives the first reference clocks from a reference clock source having an oscillator operating at an oscillation frequency, and the oscillation frequency is not an integer multiple of the third frequency.

13. A clock generating method comprising:
   receiving a plurality of first reference clocks having a same first frequency but different phases;
   receiving, by a passive mixer, the first reference clocks from a buffer stage circuit;
   receiving, by the passive mixer, a plurality of second reference clocks having a same second frequency but different phases, wherein the second frequency is different from the first frequency;
   mixing, by the passive mixer, the first reference clocks and the second reference clocks to generate a mixer output; and
   performing channel selection upon the mixer output to extract a plurality of third reference clocks from the mixer output, wherein the third reference clocks have a same third frequency but different phases, and the third frequency is different from the first frequency and the second frequency.

14. The clock generating method of claim 13, wherein the passive mixer is a voltage-mode passive mixer; and the voltage-mode passive mixer comprises a plurality of switches implemented using N-channel metal oxide semiconductor (NMOS) transistors, P-channel metal oxide semiconductor (PMOS) transistors, or complementary metal oxide semiconductor (CMOS) transistors.

15. The clock generating method of claim 13, wherein the second reference clocks are non-overlapping clocks each having a duty cycle smaller than 50%.

16. The clock generating method of claim 13, wherein the passive mixer comprises a plurality of switches each having a control node configured to receive one of the second reference clocks, and the clock generating method further comprises:
   supplying one bias voltage to the control node.

17. The clock generating method of claim 13, wherein the channel selection is performed using an inductor-capacitor (LC) tank circuit.

18. The clock generating method of claim 13, wherein the channel selection is performed using a band-pass filter.

19. The clock generating method of claim 13, wherein the channel selection is performed using a translational filter.

20. The clock generating method of claim 13, wherein the third reference clocks are LO signals of a wireless communications device.

* * * * *